United States Patent [19]

Tanaka et al.

[11] Patent Number: 5,347,145
[45] Date of Patent: Sep. 13, 1994

[54] PAD ARRANGEMENT FOR A SEMICONDUCTOR DEVICE

[75] Inventors: Hiroaki Tanaka, Yokohama; Masaru Koyanagi, Tokyo, both of Japan

[73] Assignee: Kabushiki Kaisha Toshiba, Kawasaki, Japan

[21] Appl. No.: 813,524

[22] Filed: Dec. 26, 1991

[30] Foreign Application Priority Data

Dec. 27, 1990 [JP] Japan ................................. 2-418770

[51] Int. Cl.$^5$ ............................................ H01L 23/02
[52] U.S. Cl. ...................................... 257/48; 257/203; 257/208
[58] Field of Search .................. 357/74, 75, 80, 85; 257/48, 786, 203, 207, 208; 324/158 P

[56] References Cited

U.S. PATENT DOCUMENTS

| | | | |
|---|---|---|---|
| 4,413,271 | 11/1983 | Gontowski, Jr. et al. | 357/85 |
| 4,808,844 | 2/1989 | Ozaki | 307/243 |
| 4,833,620 | 5/1989 | Takahashi | 357/40 |
| 4,884,122 | 11/1989 | Eichelberger et al. | 357/71 |
| 4,934,820 | 6/1990 | Takahashi et al. | 357/74 |
| 4,974,053 | 11/1990 | Kinoshita et al. | 357/68 |
| 5,008,827 | 4/1991 | Katsura et al. | 357/40 |
| 5,047,711 | 9/1991 | Smith et al. | 357/45 |
| 5,065,227 | 11/1991 | Frankeny et al. | 357/74 |
| 5,073,816 | 12/1991 | Wakefield et al. | 357/74 |
| 5,083,181 | 1/1992 | Yoshida et al. | 357/45 |
| 5,138,427 | 8/1992 | Furuyama | 357/75 |

FOREIGN PATENT DOCUMENTS

| | | |
|---|---|---|
| 0317963 | 5/1989 | European Pat. Off. . |
| 3712178 | 10/1987 | Fed. Rep. of Germany . |
| 60-240140 | 11/1985 | Japan . |

OTHER PUBLICATIONS

"Protecting Si Wafers Against Damage During Testing", IBM Technical Disclosure Bulletin, vol. 32, No. 4A, Sep. 1989, p. 121.

Pearson, "Masterplan (A Simplified Method of Design)", Proceedings of the 1st International Conference on SemiCustom ICs, Nov. 1981, pp. 201–213.

Primary Examiner—William Mintel
Assistant Examiner—Roy Potter
Attorney, Agent, or Firm—Banner, Birch, McKie & Beckett

[57] ABSTRACT

A semiconductor device comprises a rectangular semiconductor chip provided with an integrated circuit, and a plurality of voltage stress examination pads formed on the semiconductor chip for applying stress examination voltage to the integrated circuit, and having the same function, wherein the voltage stress examination pads are provided on opposite sides of the semiconductor chip.

27 Claims, 5 Drawing Sheets

PAD ARRANGEMENT FOR A SEMICONDUCTOR DEVICE

Background of the Invention

1. Field of the Invention

This invention relates to a semiconductor device having voltage stress examination pads for screening the device by use of a probe card and a prober, when the device is not separated from a semiconductor wafer (i.e., when the device is in a wafer stage).

2. Description of the Related Art

In a manufacturing process of semiconductor devices, in general, products are sorted into good ones and bad ones by a die-sorting test after a process for producing semiconductor wafers, and thereafter the good ones are accommodated in packages, thereby obtaining their final form. The packed products are subjected to a burn-in process.

On the other hand, U.S. patent application Ser. No. 07/544,614 has proposed a semiconductor memory which is suitable in a case where a product in a wafer stage is screened by using a probe card and a prober before it is subjected to a die-sorting process. This semiconductor memory enables each memory chip region to be screened out efficiently in a short time.

To efficiently screen out a product in a wafer stage, it is desirable to simultaneously contact probes of a probe card with voltage stress examination pads provided in all the chip regions, thereby applying voltage stress thereto.

This, however, is almost impossible in light of the present technique of probe cards. In reality, it is preferable to simultaneously contact probes with voltage stress examination pads in as many chip regions as possible.

FIG. 5 shows a state in which voltage stress examination pads 41 provided in as many chip regions 40 as possible on a semiconductor wafer are in contact with probes 42 of a conventional probe card. One-dot chain line 43 indicates a region in which the tips of probes of a probe card project. The probes 42 projecting from opposite sides of the probe card are in contact with the voltage stress examination pads 41 in eight chip regions 40.

However, highly efficient screening may not be performed by applying voltage stress to eight chip regions only.

Accordingly, it is necessary to contrive a method for enabling probes to contact with as many chip regions as possible, in a semiconductor device having voltage stress examination pads for screening using a probe card and a prober.

SUMMARY OF THE INVENTION

It is the object of the invention to provide a semiconductor device in which voltage stress examination pads provided in as many chip regions thereof as possible can be brought into contact with probes of a probe card when the device in a wafer stage is screened by using the probe card and a prober, thereby enhancing the efficiency of screening and the productivity, and hence enabling the device to be produced at low cost.

To attain the object, the semiconductor device of the invention comprises: a rectangular semiconductor chip provided with an integrated circuit; and a plurality of stress examination pads formed on the semiconductor chip for applying stress examination voltage or signal to the integrated circuit, and having the same function; wherein the voltage stress examination pads are provided at one side portion of the semiconductor chip and another portion of the semiconductor chip.

In the semiconductor device, voltage stress examination pads are concentrated at the adjacent sides of each adjacent two of chip regions arranged in two rows. By virtue of this structure, at the time of screening the device in a wafer stage, probes projecting from a side of a probe card in the same direction can be simultaneously brought into contact with the voltage stress examination pads concentrated at the adjacent sides of each adjacent two of the chip regions in two rows, while probes projecting from that side of the probe card in the same direction which is opposite to the first-mentioned side can be simultaneously brought into contact with voltage stress examination pads concentrated at the adjacent sides of each adjacent two of other chip regions also arranged in two rows.

Accordingly, probes can be brought into contact with voltage stress examination pads provided in chip regions arranged in four rows, to apply voltage stress thereto.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
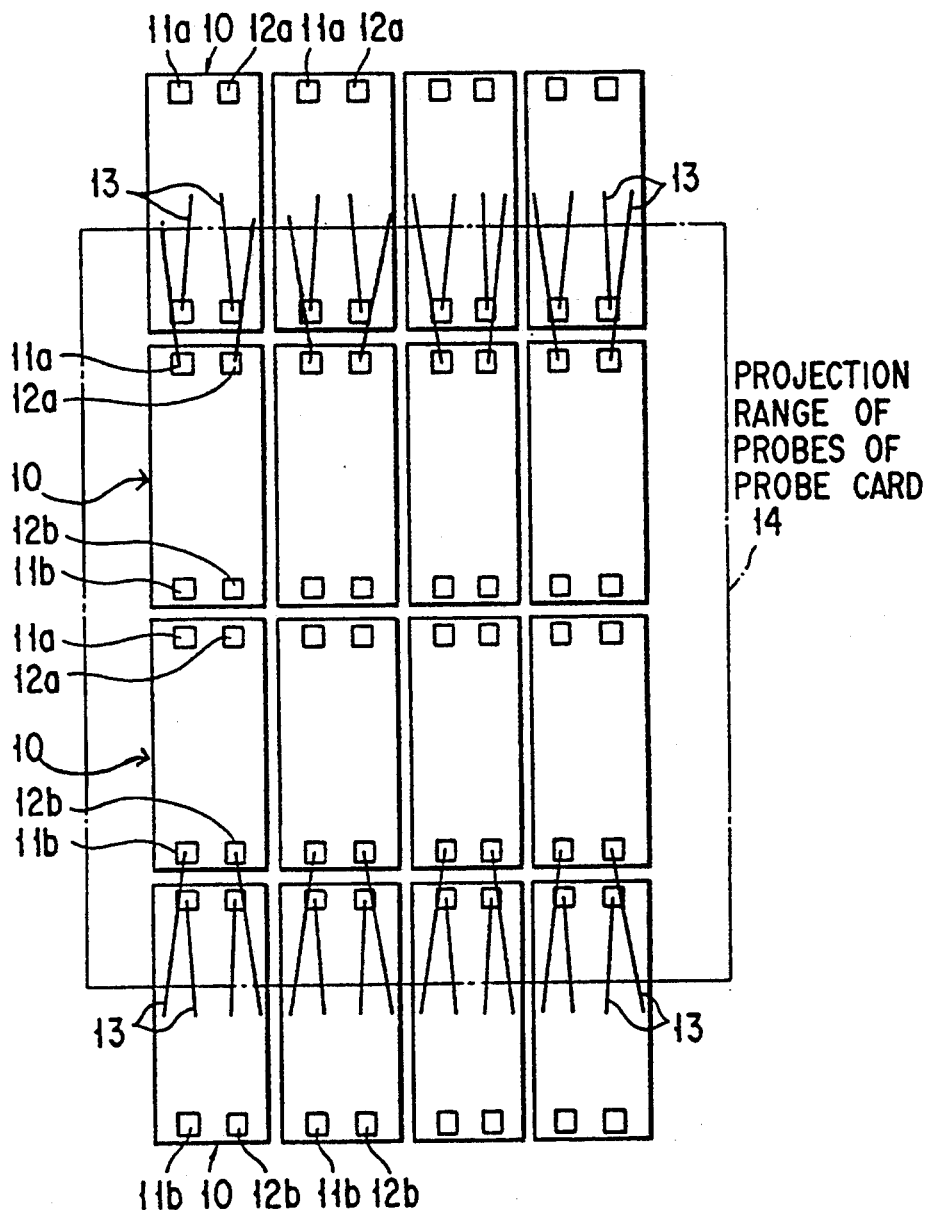
FIG. 1 is a view of a semiconductor device according to a first embodiment of the invention, showing a state in which voltage-stress examination pads provided in chip regions of the semiconductor device are in contact with probes of a probe card, the state being assumed when the device in a wafer stage is subjected to a burn-in process.

The invention will be explained with reference to the accompanying drawings showing embodiments thereof. The same reference numeral in the figures indicates the same element, and duplicate explanation will be avoided.

FIG. 1 shows a state in which probes 13 incorporated in a probe card are in contact with voltage-stress examination pads 11a, 12a, 11b and 12b provided in a plurality of rectangular chip regions 10 of a semiconductor device according to a first embodiment of the invention, the state being assumed when the semiconductor device in a wafer stage is subjected to a burn-in process.

As is shown in FIG. 1, the chip regions 10 are provided in rows and columns on a semiconductor wafer. Each chip region 10 is provided with an integrated circuit (e.g. a dynamic random access memory circuit), and with bonding pads (not shown) to be used for assembly performed after a die-sorting process and isolation of the chip, and also with voltage stress examination pads. A plurality (two in the embodiment) of groups of voltage stress examination pads 11a, 11b, 12a and 12b are provided for applying a voltage stress examination voltage or signal to the integrated circuit. In the embodiment, two pads 11a and 11b of each group are connected to each other by means of a wire (not shown), and have the same function. Similarly, the other two pads 12a and 12b are connected to each other by means of a wire (not shown), and have the same function. The pads 11a and 11b are located at opposite sides of each region 10, respectively, and are aligned with each other. Similarly, the pads 12a and 12b are located at the opposite sides, respectively, and are aligned with each other. Thus, the pads 11a and 12a are arranged adjacent to each other at one side of each region, while the pads 11b and 12b are arranged adjacent to each other at a side opposite to the first-mentioned side. Further, the order of the pads 11a and 12a is identical to that of the pads 11b and 12b.

As described above, pads required for the voltage stress examination of chip regions are concentrated at the adjacent sides of each adjacent two of the chip regions.

Then, a method of bringing the probes 13 of the probe card suitable for the above-described semiconductor wafer, into contact therewith at the time of burn-in of the wafer will be explained. One-dot chain line 14 in FIG. 1 indicates the area in which the probes 13 project.

Probes 13 projecting from a side of the probe card in the same direction are simultaneously brought into contact with voltage stress examination pads 11a, 12a, 11b and 21b concentrated at the adjacent sides of chip regions 10 arranged in two rows. Similarly, probes 13 projecting from a side opposite to the first-mentioned side in the same direction are simultaneously brought into contact with voltage stress examination pads concentrated at the adjacent sides of other chip regions of two rows arranged adjacent to the first-mentioned chip regions.

Thus, voltage stress examination pads 11a, 12a, 11b, 12b in 16 chip regions arranged in four rows and four columns can simultaneously be brought into contact with the probes 13 of the probe card, thereby simultaneously applying voltage stress to the chip regions.

Further, the probes 13 are brought into contact with the voltage stress examination pads concentrated at the adjacent sides of adjacent chips, so that variations in the lengths of the probes 13 contacting the adjacent chips can be limited in a small range, which facilitates designing of probe cards.

To subject the semiconductor device of FIG. 1 in a wafer stage, to a burn-in process using a probe card and a prober, the probes of the probe card can be simultaneously brought into contact with as many voltage stress examination pads on a plurality of chips as possible, whereby the efficiency of burn-in and that of manufacturing can be enhanced, thereby shortening the time required for burn-in and hence reducing the manufacturing cost of the device.

Thus, an IC device as a final product, obtained by separating the chips of the semiconductor wafer and accommodating each chip in a package, has a plurality of voltage stress examination pads having the same function and arranged at the opposite sides of the chip.

Figure 2:
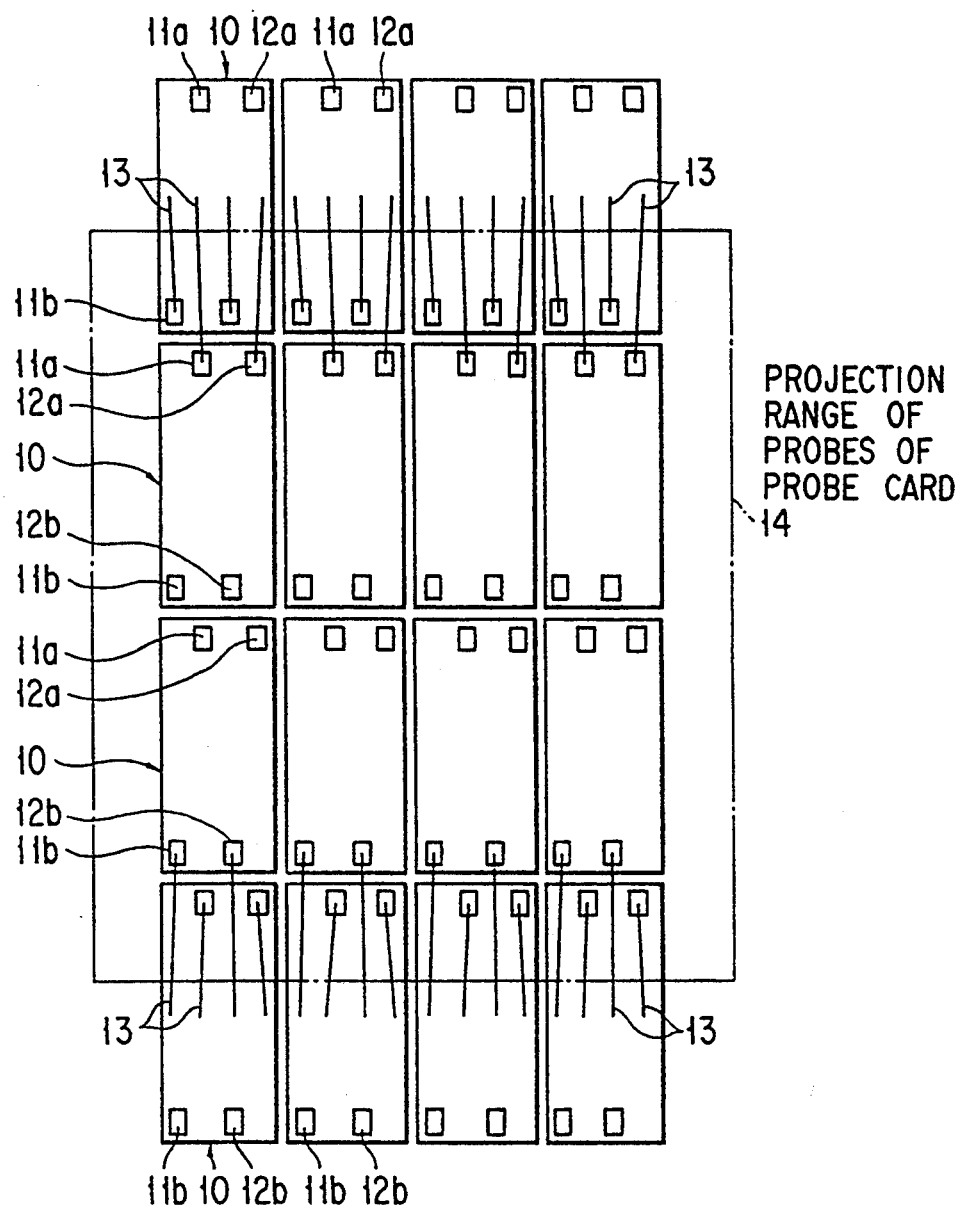
FIG. 2 is a view of a semiconductor device according to a second embodiment of the invention, showing a state in which voltage-stress examination pads provided in chip regions of the semiconductor device are in contact with probes of a probe card, the state being assumed when the device in a wafer stage is subjected to a burn-in process.

FIG. 2 shows a state in which probes 13 incorporated in a probe card are in contact with voltage-stress examination pads provided in a plurality of chip regions 10 of a semiconductor device according to regions 10 of a semiconductor device according to a second embodiment of the invention, the state being assumed when the semiconductor device in a wafer stage is subjected to a burn-in process.

In the semiconductor device of the second embodiment, though the pads 11a and 12a and the pads 11b and 12b are alternately arranged in the row direction, the pad 11a (or 12a) is not aligned with the pad 11b (or 12b), but is arranged in a zigzag manner with respect to the latter.

The device of FIG. 2 is advantageous in that the possibility that adjacent ones of probes contact each other is low when the probes, which project from a side of a probe card in the same direction, are brought into contact with voltage stress examination pads concentrated in chip regions arranged in two rows.

Figure 3:
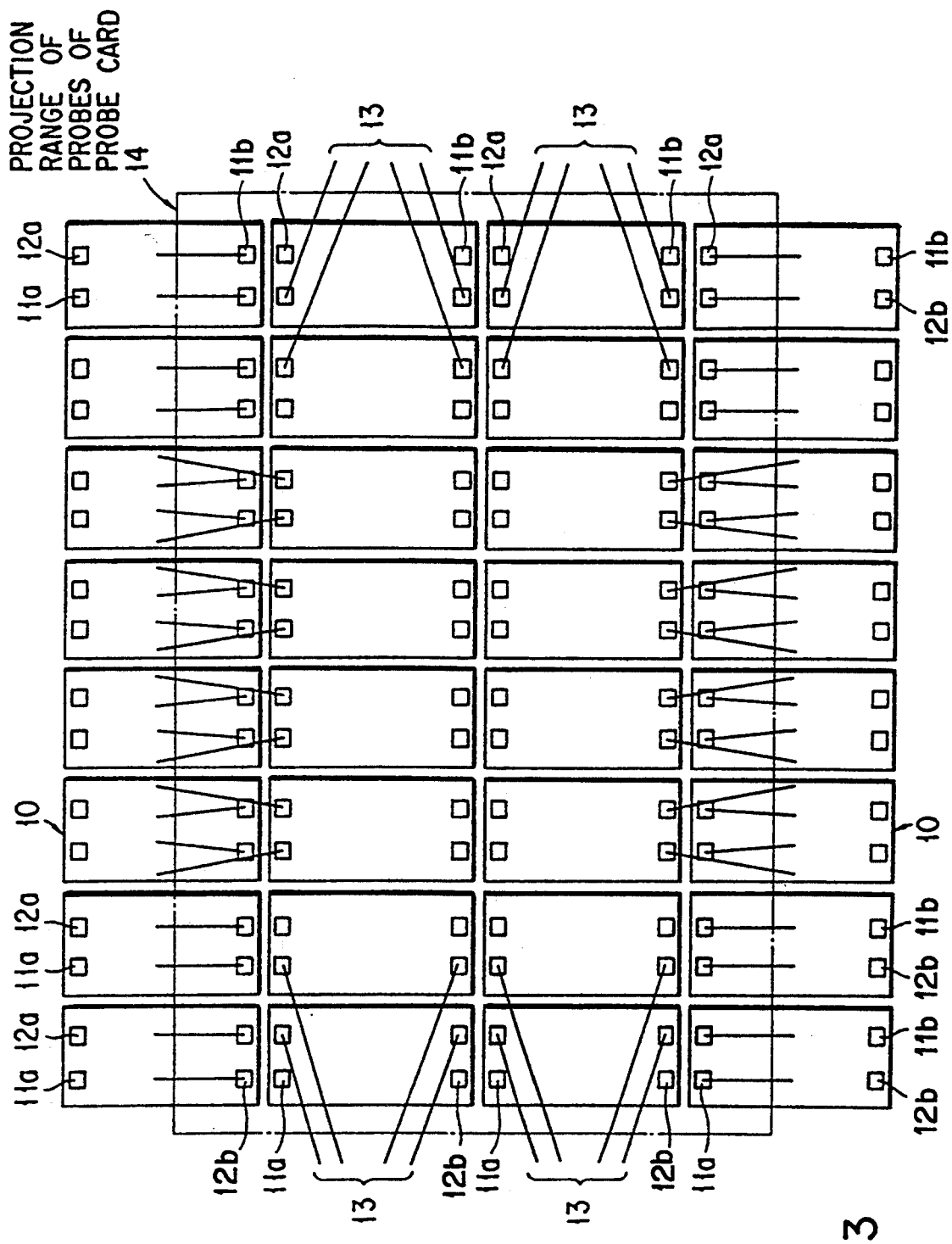
FIG. 3 is a view of a semiconductor device according to a third embodiment of the invention showing a state in which voltage-stress examination pads provided in chip regions of the semiconductor device are in contact with probes of a probe card, the state being assumed when the device in a wafer stage is subjected to a burn-in process.

FIG. 3 shows a state in which probes 13 incorporated in a probe card are in contact with voltage-stress examination pads provided in a plurality of chip regions 10 of a semiconductor device according to a third embodiment of the invention, the state being assumed when the semiconductor device in a wafer stage is subjected to a burn-in process.

In this semiconductor device, the order of the pads 11a and 12a differs from that of the pads 11b and 12b (for example, the orders are reversed).

In the semiconductor device of FIG. 3, the number of probes projecting from two opposite sides of a probe card is increased, and further probes are arranged to project from the other two opposite sides of the probe card. These probes also can be simultaneously brought into contact with four chip regions 10 located correspondingly thereto.

Figure 4:
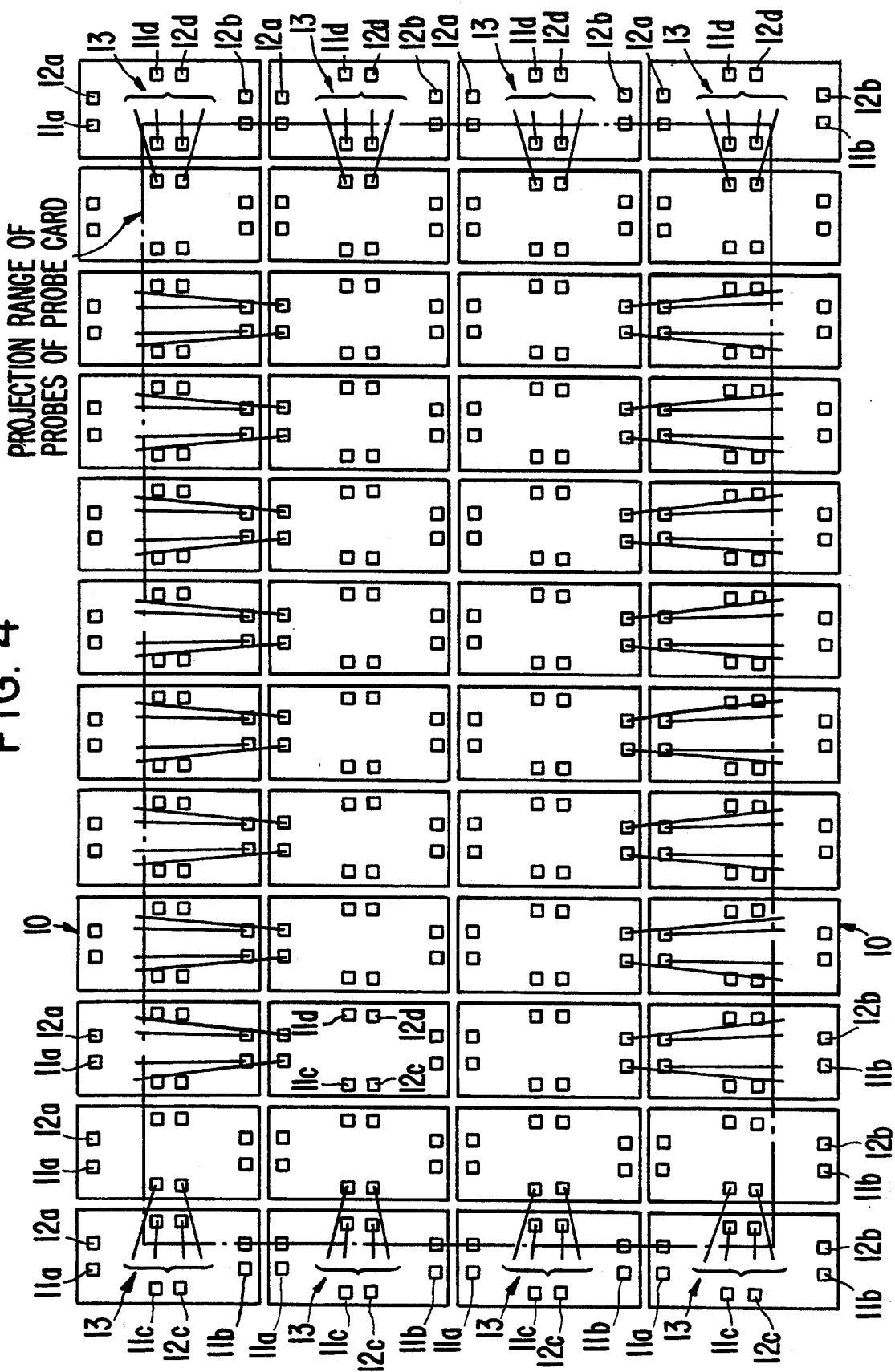
FIG. 4 is a view of a semiconductor device according to a fourth embodiment of the invention, showing a state in which voltage-stress examination pads provided in chip regions of the semiconductor device are in contact with probes of a probe card, the state being assumed when the device in a wafer stage is subjected to a burn-in process.
Figure 5:
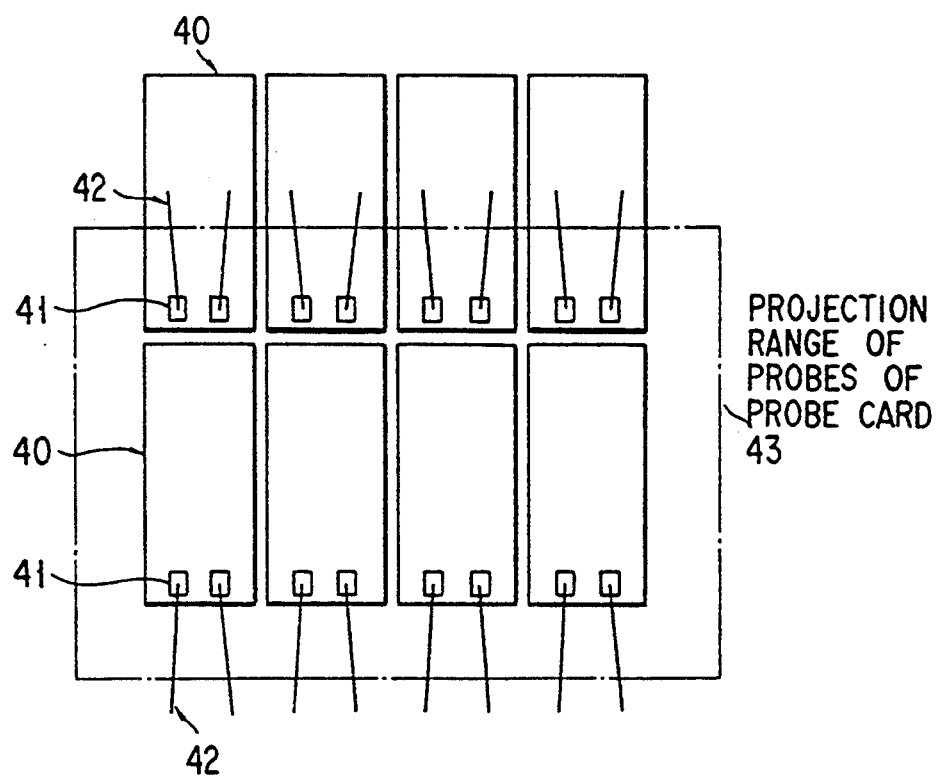
FIG. 5 is a view, showing a state in which voltage-stress examination pads provided in chip regions of the semiconductor device are in contact with probes of a conventional probe card, the state being assumed when the device in a wafer stage is subjected to a burn-in process.

Thus, the probes can contact the voltage stress examination pads provided in as many as 32 chip regions, thereby applying voltage stress to each chip. FIG. 4 shows a state in which probes 13 incorporated in a probe are in contact with voltage-stress examination pads provided in a plurality of chip regions 10 of a semiconductor device according to a fourth embodiment of the invention, the state being assumed when the semiconductor device in a wafer stage is subjected to a burn-in process.

In a fourth embodiment of the invention, voltage stress examination pads 11a, 11b, 11c, 11d, 12a, 12b, 12c, 12d are provided at the four sides of each rectangular chip region 10, and probes 13 are arranged to project from the four sides of a probe card. Thus, the probes 13 can be simultaneously brought into contact with each adjacent two of chip regions 10 arranged in the row direction. That is, the probes can be simultaneously brought into contact with voltage stress examination pads in a greater number of chip regions to apply voltage stress thereto.

In each of the above embodiments, the more the number of times the probes are brought into contact with bonding pads of a device before the device is accommodated in a package, the more the yield of wire bonding and hence that of assembly are reduced. Thus, if it is necessary to use voltage stress examination pads, provided in each chip region, for die-sorting or assembly, the pads had better be selected from those which have not been brought into contact with probes at the time of burn-in.

Accordingly, the number of times the probes are brought into contact with the pads is smaller by one time (since they are out of contact with the pads at the time of burn-in) than the conventional case, so that the pads will not be greatly injured, thereby enhancing the yield of assembly.

In addition, in a case where voltage stress examination pads in each chip region are used for assembly, the pads can be arranged independent of those locations of external pads (pins) which are predetermined depending upon the shape of a package (e.g. ZIP, SOJ).

Thus, to accommodate one chip or one mask set in a plurality of packages, the pads can be arranged so as to easily correspond to the locations of the pads (pins) of each package. Accordingly, the leads of each package can be laid out in a simple manner, enhancing the yield of assembly.

Moreover, in consideration a number of chip regions on the wafer are obtained at once so as to enable to a burn-in process, it is desirable that probes are brought, in a simple and reliable manner, into contact with voltage stress examination pads of chips which are out of a visual field of a microscope. To this end, the voltage stress examination pads may be formed larger than the bonding pads (in many cases, these pads cannot be formed large in light of the standard of input capacity) to be used for die-sorting or assembly.

The stress examination pad employed in the embodiments may be formed similar to the bonding pad, or alternatively may be a member which is capable of contacting the contact pad (made of e.g. a conductive rubber) of a probe card serving as a tester to be used when a semiconductor device in a wafer stage is subjected to a burn-in process, i.e., may be, for example, a bump to be used in TAB (Tape Automated Bonding) technique.

In the above embodiments, the invention is applied to the voltage stress examination pad, but an advantage similar to that of the embodiments can be obtained by applying the invention to a pad to be used at the time of die-sorting.

Apart from the above, a technique of providing on a chip a plurality of bonding pads, serving as power source pads is known from e.g. IEEE JOURNAL OF SOLID-STATE CIRCUITS, VOL. 23, NO. 5, OCTOBER 1988 pp. 1142, "A 20-ns 128-kbit*4 High-Speed DRAM with 330-Mbit/s Data Rate". This publication discloses a technique of providing four power source pads and four earth pads, and the object of the technique is to reduce noise caused by a power source potential VCC and an earth potential VSS in accordance with high speed operation of the device, which significantly differs from the object of the invention.

Moreover, a technique of connecting an input pad provided at an outer edge portion, to an output pad provided at an opposite outer edge portion is disclosed in Published Unexamined Japanese Patent Application (Kokai) No. 60-240140 (Nov. 29, 1985). The object of this technique is to output a signal input to a chip through its input/output pad thereof, from its output pad, and then to input the signal to another chip, which significantly differs from the technical idea of the invention.

Although the invention is applied to voltage stress examination at the time of burn-in in the abovedescribed embodiments, it is a matter of course that the invention may be applied to voltage stress examination performed irrespective of abrupt increase in temperature.

Further, the invention is not limited to the embodiments described in the specification and shown in the drawings, but may be modified without departing from the scope thereof.

Additional advantages and modifications will readily occur to those skilled in the art. Therefore, the invention in its broader aspects is not limited to the specific details, and representative devices, shown and described herein. Accordingly, various modifications may be without departing from the spirit or scope of the general inventive concept as defined by the appended claims and their equivalents.

What is claimed is:

1. A semiconductor device, comprising:
 a rectangular semiconductor chip including an integrated circuit;
 a plurality of voltage stress examination pads on said semiconductor chip for receiving a stress examination voltage to be applied to said integrated circuit, said voltage stress examination pads including groups of pads, wherein the pads of each group are connected to each other, a first pad of each group is arranged adjacent to a first side of said rectangular semiconductor chip, and a second pad of each group is arranged adjacent to a second side of said rectangular semiconductor chip, said second side being opposite said first side.

2. The semiconductor device according to claim 1, wherein the first and second pads of each group are aligned with each other.

3. The semiconductor device according to claim 1, wherein the first and second pads of each group are offset relative to each other.

4. The semiconductor device according to claim 1, wherein a pad of a first group arranged adjacent to said first side is aligned with a pad of a second group adjacent to said second side.

5. The semiconductor device according to claim 1, wherein each group of pads includes a first pad adjacent to said first side of said rectangular semiconductor chip, a second pad adjacent to said second side of said rectangular semiconductor chip, a third pad adjacent to a third side of said rectangular semiconductor chip, and a fourth pad adjacent to a fourth side of said rectangular semiconductor chip, said fourth side being opposite said third side.

6. The semiconductor device according to claim 1, wherein the pads of each group are connected to each other by wire.

7. The semiconductor device according to claim 1, wherein said voltage stress examination pads are made of a conductive rubber.

8. The semiconductor device according to any one of claims 1, 2, 3 or 4, wherein said semiconductor chip is one of a plurality of chips on a semiconductor wafer.

9. The semiconductor device according to any one of claims 1, 2 or 6, wherein the semiconductor chip is accommodated in a package, and is finished as an IC device.

10. A semiconductor device, comprising:
a rectangular semiconductor chip having an integrated circuit;
a plurality of voltage stress examination pads on said semiconductor chip for receiving a stress examination signal to be applied to said integrated circuit, said voltage stress examination pads including groups of pads, wherein the pads of each group are connected to each other, a first pad of each group is arranged adjacent to a first side of said rectangular semiconductor chip, and a second pad of each group is arranged adjacent to a second side of said rectangular semiconductor chip, said second side being opposite said first side.

11. The semiconductor device according to claim 10, wherein the first and second pads of each group are aligned with each other.

12. The semiconductor device according to claim 10, wherein the first and second pads of each group are offset relative to each other.

13. The semiconductor device according to claim 10, wherein a pad of a first group arranged on said first side is aligned with a pad of a second group on said second side.

14. The semiconductor device according to claim 10, wherein each group of pads includes a first pad adjacent to said first side of said rectangular semiconductor chip, a second pad adjacent to said second side of said rectangular semiconductor chip, a third pad adjacent to a third side of said rectangular semiconductor chip, and a fourth pad adjacent to a fourth side of said rectangular semiconductor chip, said fourth side being opposite said third side.

15. The semiconductor device according to claim 10, wherein the pads of each group are connected to each other by wire.

16. The semiconductor device according to claim 10, wherein said voltage stress examination pads are made of a conductive rubber.

17. The semiconductor device according to any one of claims 10 to 14, wherein said semiconductor chip is one of a plurality of chips on a semiconductor wafer.

18. The semiconductor device according to any one of claims 10 to 14, wherein the semiconductor chip is accommodated in a package, and is finished as an IC device.

19. A semiconductor device, comprising:
semiconductor chips arranged in rows and columns on a semiconductor wafer, each semiconductor chip including an integrated circuit;
a plurality of pads on each semiconductor chip connected to the corresponding integrated circuit, each semiconductor chip including a group of pads, wherein the pads of each group are connected to each other, a first pad of said group is arranged adjacent to a first side of said semiconductor chip, and a second pad of said group is arranged adjacent to a second side of said semiconductor chip, said second side being opposite said first side.

20. The semiconductor device according to claim 19, wherein the first pad of a first group is aligned along the column direction with the second pad of the first group.

21. The semiconductor device according to claim 19, wherein the first pad of a first group is offset in a column direction with respect to the second pad of the first group.

22. The semiconductor device according to claim 19, wherein each semiconductor chip includes at least two groups of pads, one pad of a first group being aligned in the column direction with one pad of a second group.

23. The semiconductor device according to claim 19, wherein at least one semiconductor chip is a rectangular semiconductor chip and includes a group of pads comprising a first pad adjacent to said first side of said one rectangular semiconductor chip, a second pad adjacent to said second side of said one rectangular semiconductor chip, a third pad adjacent to a third side of said one rectangular semiconductor chip, and a fourth pad adjacent to a fourth side of said one rectangular semiconductor chip, said fourth side being opposite said third side.

24. The semiconductor device according to claim 19, wherein the pads of each group are connected to each other by wire.

25. A system for simultaneously subjecting a plurality of integrated circuits in semiconductor chip regions to a voltage stress examination, said semiconductor chip regions arranged in rows and columns on a semiconductor wafer and each semiconductor chip region having groups of voltage stress examination pads, wherein the pads of each group are connected to each other, a first pad of each group is arranged adjacent to a first side of said each semiconductor chip region, and a second pad of each group is arranged on a second side of said each semiconductor chip region, said second side being opposite said first side, wherein said system includes a probe card having probes extending from opposed first and second sides thereof, the probes extending from the first side being arranged to contact, during the voltage stress examination, voltage examination pads adjacent to a side of a first semiconductor region in a first row and voltage examination pads adjacent to a side of a second semiconductor chip region in a second row, wherein said side of said second semiconductor chip region is adjacent to said side of said first semiconductor region.

26. The system according to claim 25, wherein each group of pads includes a first pad adjacent to said first side of said semiconductor chip, a second pad adjacent to said second side of said semiconductor chip, a third pad adjacent to a third side of said semiconductor chip, and a fourth pad adjacent to a fourth side of said semiconductor chip, said fourth side being opposite said third side, and wherein said probe includes third and fourth opposed sides substantially perpendicular to said first and second opposed sides and having probes extending therefrom, the probes extending from the third side being arranged to contact, during the voltage stress examination, voltage examination pads adjacent to a side of a third semiconductor region in a first column and voltage examination pads adjacent to a side of a fourth semiconductor chip region in a second column, wherein said side of said third semiconductor chip region is adjacent to said side of said fourth semiconductor region.

27. A semiconductor device, comprising:
a semiconductor chip including an integrated circuit;
a plurality of voltage stress examination pads on said semiconductor chip for receiving a stress examination signal to be applied to said integrated circuit, said voltage stress examination pads including groups of pads, wherein the pads of each group are connected to each other, a first pad of each group is arranged adjacent to a first side of said semiconductor chip, and a second pad of each group is arranged adjacent to a second side of said semiconductor chip.

* * * * *